United States Patent [19]

Brook et al.

[11] Patent Number: 4,993,622

[45] Date of Patent: Feb. 19, 1991

[54] SEMICONDUCTOR INTEGRATED CIRCUIT CHIP INTERCONNECTIONS AND METHODS

[75] Inventors: Richard M. Brook, Sherman; Thomas H. Ramsey, Garland, both of Tex.

[73] Assignee: Texas Instruments Incorporated, Dallas, Tex.

[21] Appl. No.: 157,090

[22] Filed: Feb. 9, 1988

Related U.S. Application Data

[63] Continuation-in-part of Ser. No. 43,290, Apr. 28, 1987, abandoned.

[51] Int. Cl.$^5$ .................... B23K 20/22; B23K 101/40; H01L 21/603
[52] U.S. Cl. ................... 228/179; 228/263.17; 228/263.18; 357/67
[58] Field of Search ............... 228/110, 111, 122–124, 228/179, 263.18, 4.5, 1.1; 29/854; 219/56.21, 56.22; 174/126.2; 420/507; 357/67

[56] References Cited

U.S. PATENT DOCUMENTS

| | | | |
|---|---|---|---|
| 1,023,334 | 4/1912 | Rossi | 420/507 |
| 2,015,499 | 9/1935 | Smith | 420/507 |
| 3,124,493 | 3/1964 | Matlow | 228/123 |
| 3,136,032 | 6/1964 | Berndsen | 228/179 |
| 4,027,326 | 5/1977 | Kummer et al. | 357/67 |
| 4,380,775 | 4/1983 | Bischoff | 357/67 |
| 4,415,115 | 11/1983 | James | 228/179 |
| 4,488,674 | 12/1984 | Egawa et al. | 228/179 |
| 4,549,059 | 10/1985 | Kamijo et al. | 219/56.21 |
| 4,674,671 | 6/1987 | Fister et al. | 228/179 |
| 4,705,204 | 11/1987 | Hirota et al. | 219/56.22 |
| 4,717,066 | 1/1988 | Goldenberg et al. | 228/179 |
| 4,752,442 | 6/1988 | Asada et al. | 420/507 |

FOREIGN PATENT DOCUMENTS

| | | | |
|---|---|---|---|
| 101299 | 2/1984 | European Pat. Off. | |
| 142447 | 5/1985 | European Pat. Off. | |
| 2649773 | 5/1978 | Fed. Rep. of Germany | |
| 90949 | 6/1982 | Japan | 420/507 |
| 90951 | 6/1982 | Japan | 420/507 |
| 90952 | 6/1982 | Japan | 420/507 |
| 90954 | 6/1982 | Japan | 420/507 |
| 199533 | 11/1983 | Japan | 357/67 |
| 65439 | 4/1984 | Japan | 420/507 |
| 65440 | 4/1984 | Japan | 420/507 |
| 2131730 | 6/1984 | United Kingdom | 228/179 |

OTHER PUBLICATIONS

Welding Handbook, Seventh Edition, vol. 4, pp. 499, 500, copywright 1982.
IBM Technical Disclosure Bulletin, "Copper Doped Aluminum Stripes", vol. 13, No. 7, p. 1748, Dec. 1970.
IBM Technical Disclosure Bulletin, "Thin Film stripes . . . ", vol. 14, No. 2, pp. 596, 597, Jul. 1971.
Christensen, H., "Thermo-Compression . . . ", Bell Laboratories Record, pp. 127–130, Apr., 1958.
Metals Handbook, Ninth edition, vol. 2, "Gold Alloys", p. 679, Copyright 1979.
Bruce L. Gehman, "Gold Wire for Automated Bonding", Solid State Technology, pp. 84–91, Mar. 1980.
Metallurgical Behavior of Gold Wire In Thermal Compression Bonding, T. H. Ramsey, Solid State Technology, Oct. 1973, pp. 43–47.

*Primary Examiner*—Sam Heinrich
*Attorney, Agent, or Firm*—James F. Hollander; Thomas W. DeMond; Melvin Sharp

[57] ABSTRACT

The disclosure relates to an electrical connection between a bonding pad on a semiconductor chip and a wire wherein the bonding pad is formed of copper doped aluminum and the wire is formed of copper doped gold. The wire has from about 100 to about 10,000 parts per million copper and the pad has from about 5000 to about 50,000 parts per million copper.

47 Claims, No Drawings

SEMICONDUCTOR INTEGRATED CIRCUIT CHIP INTERCONNECTIONS AND METHODS

This application is a continuation-in-part of application Ser. No. 043,290, filed Apr. 28, 1987, now abandoned.

BACKGROUND OF THE INVENTION

1. Field of the Invention

This invention relates to an electrical connection between copper doped wire and copper doped aluminum bonding pads forming a part of a semiconductor circuit.

2. Brief Description of the Prior Art

It is often desirable to utilize doped metallization in semiconductor devices. A first doped aluminum metallization including the bonding pads are required to obtain certain desired metallurgical characteristics on semiconductor devices. When alloyed with a second metal, e.g., copper, significantly increased hardness and toughness of the aluminum metallization is achieved. These characteristics are fundamental to an integrated circuits's ability to withstand the thermal stress, induced in the active circuitry of the device by the expansion and contraction of plastic encapsulant. The ability of a plastic encapsulated semiconductor device to withstand stress induced during temperature cycling between −66 degrees C. and 150 degrees C. is a requirement outlined in mil-standards and by most major commercial users. As the bonding pad becomes harder, the standard gold wire (a third metal) becomes less apt to properly bond thereto as compared to the undoped bonding pad wherein the gold is relatively soft compared with the doped bonding pad. It is known that wires generally should be harder than the bonding pad material. The wire of choice presently used in semiconductor applications is a gold wire. Gold wire doped with a fourth metal, beryllium for use in semiconductor applications is discussed in an article entitled Metallurgical Behavior of Gold Wire In Thermal Compression Bonding, T. H. Ramsey, Solid State Technology, October 1973, pages 43 to 47, which is incorporated herein by reference.

However, a problem exists with the current technology of thermosonic ball bonding of standard beryllium doped gold wire to copper doped aluminum metallization in the form of bonding pads due to the increased hardness and toughness in that standard gold wire of the type described hereinabove is of insufficient hardness to cause the level of plastic flow of the integrated circuit metallization as was achieved with standard aluminum integrated circuit metallization. It is therefore necessary to provide wire for bonding to copper doped aluminum pads which is of sufficient hardness to overcome the problems noted hereinabove and provide a reliable bond to the pad.

SUMMARY OF THE INVENTION

In accordance with the present invention, the above noted problems of the prior art are materially minimized and there is provided an electrical connection to copper (second metal) doped aluminum (first metal) metallization in the form of bonding pads in semiconductor devices by forming wire of a third metal, gold, which has been doped with from about 100 to about 10,000 parts per million of the second metal, copper and making electrical connection therewith. With such wire, the hardness is significantly increased without introducing a new metal into the system. Since copper metallization is compatible with gold, bonding results are improved for bonding of gold to copper doped aluminum.

In accordance with the present invention, gold and copper, in the desired ratio, are placed in a crucible and heated to the point where the entire mass is a liquid. The mass is than agitated, such as by ultrasonic agitation, while in the crucible to provide a uniform mixture of the gold and copper. The copper doped gold is then cooled to form a solid ingot of gold with the copper homogeneously dispersed therethrough in the predesired amount. The ingot is then drawn out in standard manner to the desired diameter to form a wire of gold doped with copper. This wire is then ball bonded to copper doped aluminum pads of semiconductor devices to provide the desired bonds as discussed hereinabove. The gold wire has from about 100 to about 10,000 parts per million copper therein.

DESCRIPTION OF THE PREFERRED EMBODIMENT

A gold wire for use in accordance with the present invention was produced by depositing a 1000.0 gram ingot of 99.95% pure gold in a crucible of any type that does not contaminate the gold along with 5 grams of 99.99% pure copper. The crucible was placed in a nitrogen atmosphere and heated until the gold and copper had melted. While retaining the melted gold and copper at this temperature, the mixture was ultrasonically agitated for thirty minutes to thoroughly mix the gold and copper and provide a homogeneous mixture thereof. The mixture was allowed to cool to room temperature, whereupon the crucible was removed from the nitrogen atmosphere. The ingot that had been formed in the crucible was then worked in standard manner to form a spool of 1 mil diameter wire. This was accomplished by forcing the ingot through progressively smaller apertures whereby the ingot was drawn out into continually smaller diameter wires until the desired diameter was reached. A semiconductor chip having from about 0.5 to about 5% copper and preferably 2.0% copper doped aluminum bonding pads thereon was then provided and a piece of the copper doped wire was ball bonded thereto in standard manner as discussed in the above noted publication. The bond was then investigated and was found to be of high quality by yielding wire pull strengths of up to 50% greater than was achieved previously with aluminum metallization and standard gold wire.

It is readily apparent that a bond between copper doped aluminum pads and copper doped gold wire is reliable and does not degrade the pad itself by introducing unwanted impurities into the pad which degrade the pad and, possibly, the connection.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. An electrical connection of a wire to a bonding pad, comprising:
   (a) a semiconductor chip having a copper doped aluminum bonding pad thereon; and (b) a copper doped gold wire bonded to said bonding pad wherein said wire has from more than 100 to about 10,000 parts per million copper and the remainder substantially all gold.

2. The electrical connection of claim 1 wherein said bonding pad has from about 5000 to about 50,000 parts per million copper and the rest substantially all aluminum.

3. An electrical connection of a wire to a bonding pad, comprising:
(a) a semiconductor chip having a copper doped aluminum bonding pad thereon wherein said bonding pad has from more than 5000 to about 50,000 parts per million copper and the rest substantially all aluminum; and
(b) a copper doped gold wire bonded to said bonding pad.

4. A method of making an electrical connection, comprising the steps of:
(a) providing a semiconductor chip having a copper doped aluminum bonding pad thereon;
(b) providing a copper doped gold wire wherein said wire has from more than 100 to about 10,000 parts per million copper and the remainder substantially all gold; and
(c) bonding said wire to said bonding pad.

5. The method of claim 4 wherein said bond step comprises ball bonding.

6. The method of claim 5 wherein said bonding pad has from about 5000 to about 50,000 parts per million copper and the rest substantially all aluminum.

7. The method of claim 4 wherein said bonding pad has from about 5000 to about 50,000 parts per million copper and the rest substantially all aluminum.

8. A method of making an electrical connection, comprising the steps of:
(a) providing a semiconductor chip having a copper doped aluminum bonding pad thereon wherein said bonding pad has from more than 5000 to about 50,000 parts per million copper and the rest substantially all aluminum;
(b) providing a copper doped gold wire; and
(c) providing said wire to said bonding pad.

9. The method of claim 8 wherein said bond step comprises ball bonding.

10. An electrical connection of a wire to a bonding pad, comprising:
(a) a semiconductor chip having a bonding pad thereon comprising a first metal doped with a second metal;
(b) a wire comprising a third metal doped with more than 100 to about 10,000 parts per million of the second metal and bonded to said bonding pad.

11. The electrical connection of claim 1 wherein the first metal is aluminum.

12. The electrical connection of claim 1 wherein the second metal is copper.

13. The electrical connection of claim 1 wherein the third metal is gold.

14. An electrical connection of a wire to a bonding pad comprising:
(a) a semiconductor chip having a bonding pad thereon comprising aluminum doped with a second metal;
(b) a wire bonded to said bonding pad comprising gold doped with more than 100 to about 10,000 parts per million of the second metal.

15. The electrical connection of claim 14 wherein the second metal is copper.

16. An electrical assembly comprising a bonding wire, and a semiconductor chip bonding pad of a first metal doped with a second metal, said bonding wire electrically connected to said pad and comprising a third metal doped with more than 100 to about 10,000 parts per million of the second metal.

17. The electrical assembly of claim 16 wherein the second metal is copper.

18. The electrical assembly of claim 16 wherein the third metal is gold.

19. The electrical assembly of claim 18 wherein the second metal is copper.

20. An electrical assembly comprising a bonding wire, and a semiconductor chip bonding pad of aluminum doped with a second metal, said bonding wire electrically connected to said pad and comprising a third metal doped with more than 100 to about 10,000 parts per million of the second metal.

21. The electrical assembly of claim 20 wherein the second metal is copper.

22. The electrical assembly of claim 20 wherein the third metal is gold.

23. The electrical assembly of claim 22 wherein the second metal is copper.

24. A method of making an electrical connection, comprising the steps of:
(a) providing a semiconductor chip having thereon a bonding pad of a first metal doped with a second metal;
(b) providing a wire of a third metal doped with more than 100 to about 10,000 parts per million of the second metal; and
(c) bonding said wire to said bonding pad.

25. The method of claim 24 wherein the bonding step comprises ball bonding.

26. The method of claim 24 wherein the first metal comprises aluminum.

27. The method of claim 26 wherein the second metal comprises copper.

28. The method of claim 27 wherein the third metal comprises gold.

29. The method of claim 24 wherein the second metal comprises copper.

30. The method of claim 29 wherein the first metal comprises aluminum and the third metal comprises gold.

31. The method of claim 29 wherein the third metal comprises gold.

32. The method of claim 31 wherein the first metal comprises aluminum and the second metal comprises copper.

33. An electrical connection of a wire to a bonding pad, comprising:
(a) a semiconductor chip having a bonding pad thereon; and
(b) a copper doped gold wire bonded to said bonding pad wherein said wire has from more than 100 to 10,000 parts per million copper.

34. The electrical connection of claim 33 wherein said bonding pad has from about 5000 to about 50,000 parts per million copper and the rest substantially all aluminum.

35. An electrical connection of a wire to a bonding pad, comprising:
(a) a semiconductor chip having a bonding pad wherein said bonding pad has from more than 5000 to about 50,000 parts per million copper and the rest substantially all aluminum; and (b) a copper doped gold wire bonded to said bonding pad.

36. A method of making an electrical connection, comprising the steps of:
 (a) providing a semiconductor chip having a bonding pad thereon;
 (b) providing a copper doped gold wire wherein said wire has from more than 100 to about 10,000 parts per million copper and the remainder substantially all gold; and
 (c) bonding said wire to said bonding pad.

37. The method of claim 36 wherein said bond step comprises ball bonding.

38. The method of claim 37 wherein said bonding pad has from 5000 to about 50,000 parts per million copper and the rest substantially all aluminum.

39. The method of claim 34 wherein said bonding pad has from about 5000 to about 50,000 parts per million copper and the rest substantially all aluminum.

40. A method of making an electrical connection, comprising the steps of:
 (a) providing a semiconductor chip having a bonding pad thereon wherein said bonding pad has from more than 5000 to about 50,000 parts per million copper and the rest substantially all aluminum;
 (b) providing a copper doped gold wire; and
 (c) bonding said wire to said bonding pad.

41. The method of claim 40 wherein said bond step comprises ball bonding.

42. A semiconductor integrated circuit chip improved with an electrical connection of a doped wire to a doped bonding pad on the chip wherein said doped wire has more than 100 to about 10,000 parts per million dopant and said doped bonding pad is doped with same said dopant.

43. A semiconductor integrated circuit chip of claim 42 wherein said dopant is copper.

44. A semiconductor integrated circuit chip of claim 42 wherein said bonding pad is aluminum doped with 0.5 to 5% copper.

45. A method of making an electrical connection comprising the steps of:
 (a) providing a semiconductor chip incorporating a plurality of bonding pads doped with a dopant;
 (b) providing an electrical conductor doped with more than 100 to 10,000 parts per million of said dopant; and
 (c) bonding said electrical conductor to said bonding pad.

46. A method of claim 45 wherein said dopant is copper.

47. A method of claim 45 wherein said bonding pad is made of aluminum doped with 0.5 to 5% copper.

* * * * *